United States Patent [19]

Man et al.

[11] Patent Number: 5,677,477
[45] Date of Patent: Oct. 14, 1997

[54] HERMETIC PRESSURE SENSOR TEST CHAMBER

[75] Inventors: Chi Soon Man; Lee Jae In; Kim Yong Kyum, all of Seoul; Oh Tae Hyung, Kungki-do, all of Rep. of Korea

[73] Assignee: Motorola, Inc., Schaumburg, Ill.

[21] Appl. No.: 603,110

[22] Filed: Feb. 20, 1996

[51] Int. Cl.$^6$ ............................................. G01M 3/02
[52] U.S. Cl. ............................................................ 73/37
[58] Field of Search .................... 73/4 R, 4 V, 37, 73/40.7, 865.6, 12.07, 12.08

[56] References Cited

U.S. PATENT DOCUMENTS

| | | | |
|---|---|---|---|
| 2,661,121 | 8/1953 | Coffman et al. | 220/89 |
| 3,485,082 | 12/1969 | Myers | 73/4 |
| 3,738,158 | 6/1973 | Farrell et al. | 73/40.7 |
| 3,751,989 | 8/1973 | Briggs et al. | 73/40.7 |
| 4,408,194 | 10/1983 | Thompson | 340/626 |
| 4,683,757 | 8/1987 | Adams et al. | 73/756 |
| 4,708,012 | 11/1987 | Follk et al. | 73/4 R |
| 4,733,553 | 3/1988 | Folk et al. | 73/4 R |
| 4,777,716 | 10/1988 | Folk et al. | 29/593 |
| 4,825,684 | 5/1989 | Nishiguchi et al. | 73/4 R |
| 4,905,722 | 3/1990 | Rooker et al. | 137/68.1 |
| 4,975,390 | 12/1990 | Fujii et al. | 437/228 |

*Primary Examiner*—Michael Brock
*Assistant Examiner*—Jay L. Politzer
*Attorney, Agent, or Firm*—Robert F. Hightower

[57] ABSTRACT

A hermetic enclosure 100 comprising a socket 155, an inlet 110 coupled to a compressor 105 via a pressure valve 115, and an outlet 130 coupled to a vacuum generator 140 via a vacuum valve 135, for over pressure testing a pressure sensitive device 10. Locating the pressure sensitive device in the socket 155 in the hermetic chamber 100, applying a predetermined pressure generated by the compressor 105 to the pressure sensitive device in the enclosure 100. Subsequently relieving the predetermined pressure and applying a predetermined vacuum generated by the vacuum generator 140 to the pressure sensitive device 10 to remove fragments of the pressure sensitive device 10, when the pressure sensitive device 10 fails the over pressure test and disintegrates.

18 Claims, 2 Drawing Sheets

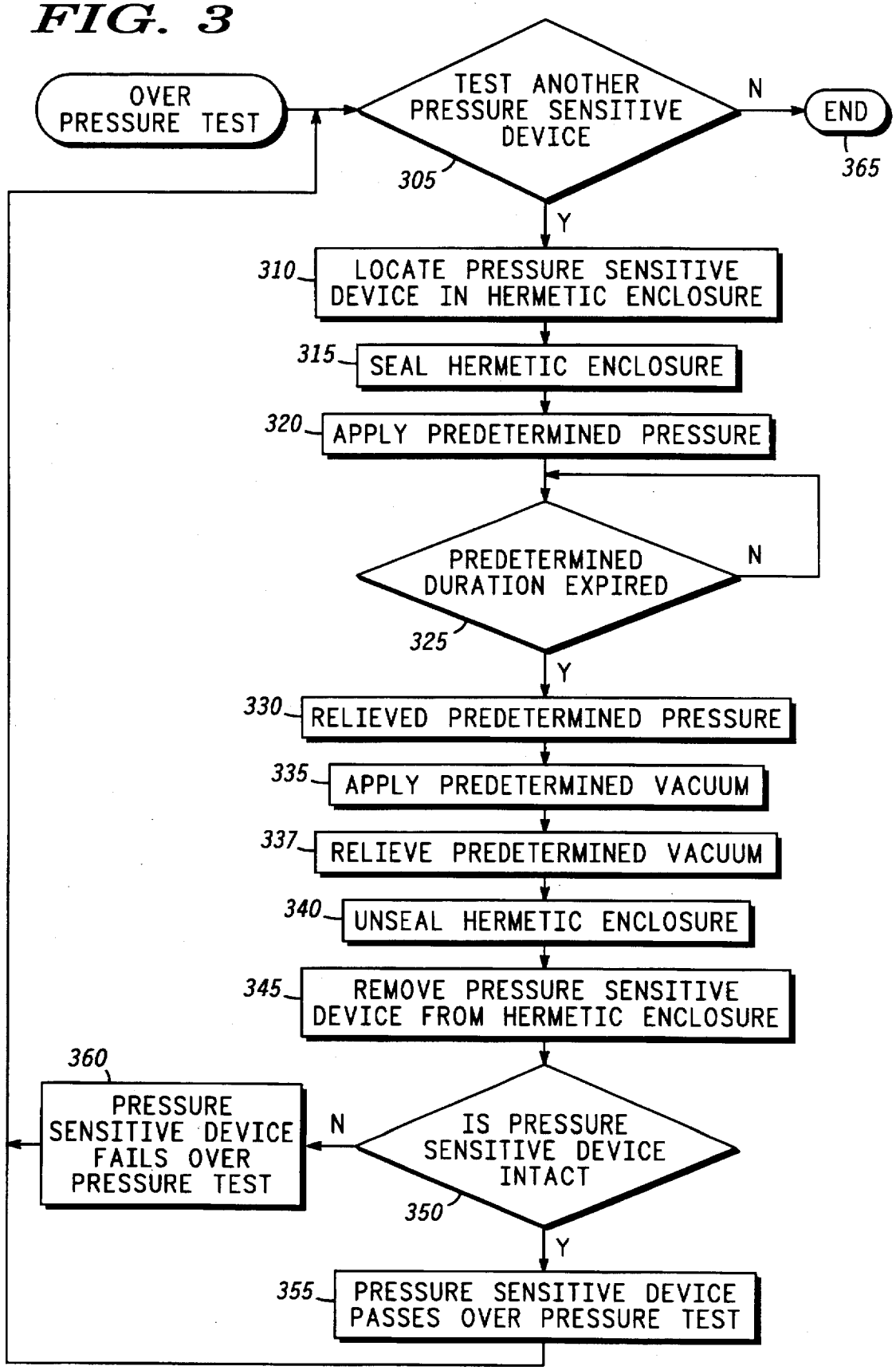

HERMETIC PRESSURE SENSOR TEST CHAMBER

FIELD OF THE INVENTION

The invention relates in general to a hermetic pressure test chamber, and in particular to a pressure test chamber for a pressure sensitive integrated circuit (IC).

BACKGROUND OF THE INVENTION

Pressure sensor IC's are used in medical equipment such as in automatic high blood pressure meters. Consequently, the pressure sensor ICs must meet stringent pressure test parameters, and the contamination to which the pressure sensor IC is exposed during manufacture must be strictly maintained.

An important test during the manufacture of pressure sensor ICs is the over pressure test, which is a destructive test. In a conventional over pressure test, a pressure sensor IC, which has been singulated from a semiconductor wafer, and mounted and wire bonded to a substrate, is placed in a pressure chamber. The pressure in the pressure chamber is then increased to an extreme pressure which is maintained for a predetermined duration. If the pressure sensor IC remains intact for the predetermined duration, the pressure sensor IC under test passes the over pressure test. However, when the pressure sensor IC fails the over pressure test, the pressure sensor IC disintegrates dispersing fragments within the test chamber. A disadvantage of this method is, the fragments of the disintegrated pressure sensor IC contaminates the interior of the test chamber, which contaminates pressure sensor ICs that are subsequently tested in the test chamber.

Hence, there is a need for an over pressure test chamber for testing pressure sensor ICs which does not cause contamination.

SUMMARY OF THE INVENTION

In carrying out the objects of the present invention in one form, there is provided a method for over pressure testing a pressure sensitive device, the method comprising the steps of: locating the pressure sensitive device in a socket in a hermetic enclosure having an inlet and an outlet; applying a predetermined pressure to the pressure sensitive device via the inlet of the hermetic enclosure; applying a predetermined vacuum to the pressure sensitive device via the outlet of the hermetic enclosure; and removing the pressure sensitive device from within the enclosure.

In carrying out the objects of the present invention in another form, there is provided an apparatus for over pressure testing a pressure sensitive device, the apparatus comprising: a hermetic enclosure comprising: a socket for securing the pressure sensitive device thereon; an inlet coupled to a compressor for applying a predetermined pressure to the pressure sensitive device; and an outlet coupled to a vacuum generator for applying a predetermined vacuum to the pressure sensitive device.

BRIEF DESCRIPTION OF THE DRAWINGS

FIG. 3 illustrates a flowchart detailing the operation of the over pressure test chamber in FIG. 1 in accordance with the preferred embodiment of the present invention.

DETAILED DESCRIPTION OF THE INVENTION

Figure 1:
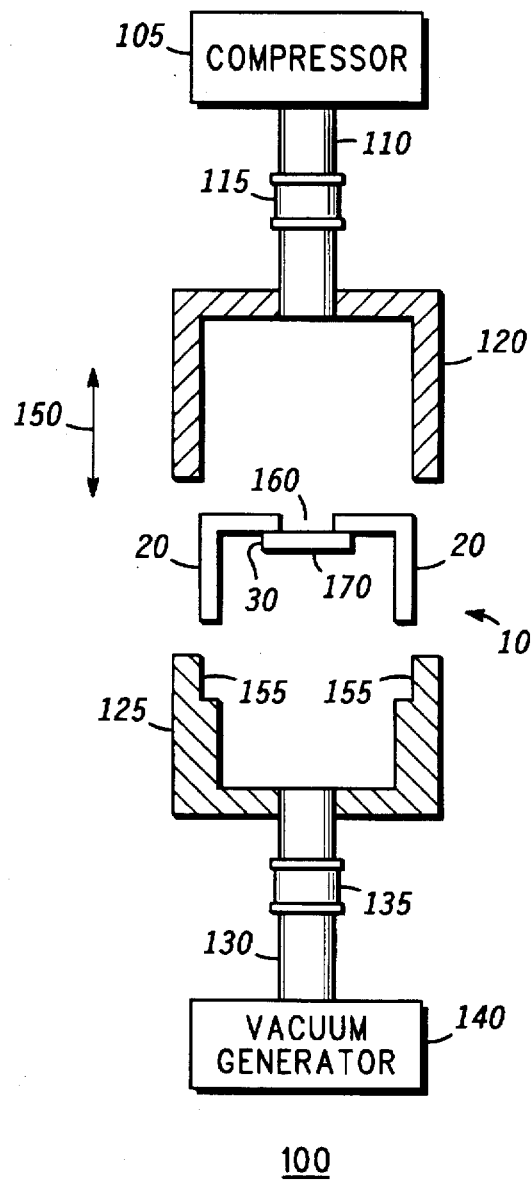
FIG. 1 illustrates an over pressure test chamber in accordance with the preferred embodiment of the present invention.

FIG. 1 illustrates a hermetic enclosure 100 for over pressure testing a pressure sensitive device 10. The pressure sensitive device 10 comprises a semiconductor integrated circuit 30 mounted on a substrate 20. The hermetic enclosure 100 comprises a first chamber 120 and a second chamber 125. The first chamber 120 has an inlet 110 which is coupled to a compressor 105. The second chamber 125 has an outlet 130 which is coupled to a vacuum generator 140. A pressure valve 115 couples or de-couples the compressor 105 from the first chamber 120, and a vacuum valve 135 is coupled between the vacuum generator 140 and the second chamber 125 for coupling or de-coupling the vacuum generator 140 from the second chamber 125. The second chamber 125 has a socket 155 in which the pressure sensitive device 10 is secured. The compressor 105 generates a predetermined pressure which is applied to the pressure sensitive device 10 via the inlet 110. The vacuum generator 140 generates a predetermined vacuum which is applied to the pressure sensitive device 10 via the outlet 130. The first and second chambers 120 and 125 separate allowing the pressure sensitive device 10 to be located between the first and the second chamber 120 and 125. The first and second chamber 120 and 125 intercouple to seal the pressure sensitive device 10 in the hermetic enclosure 100. The first chamber 120 confines the predetermined pressure from the compressor 105 to a first side 160 of the pressure sensitive device 10, and the second chamber 125 confines the predetermined vacuum to a second side 170 of the pressure sensitive device 10. In the preferred embodiment of the present invention, the first side 160 of the pressure sensitive device 10 is diametric to the second side 170 of the pressure sensitive device 10. Further, in the preferred embodiment of the present invention, the second chamber 125 remains rigid or fixed while the first chamber 120 moves downwards in a vertical direction 150 to intercouple with the second chamber 124, and the first chamber 120 moves upwards in the vertical direction 150 to separate from the second chamber 124.

Figure 2:
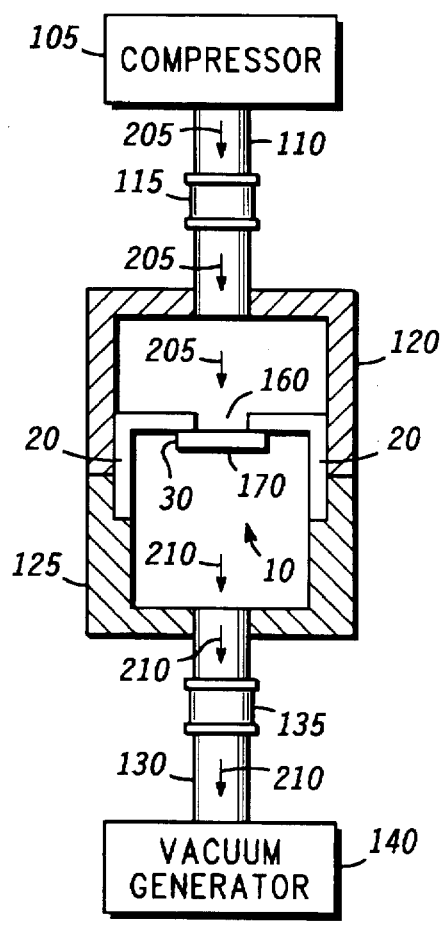
FIG. 2 illustrates the over pressure test chamber in FIG. 1 in accordance with the preferred embodiment of the present invention.

FIG. 2 illustrates the pressure sensitive device 10 sealed within the hermetic enclosure 100. When the pressure valve 115 couples the compressor 105 to the first chamber 120 and the vacuum valve 135 de-couples the vacuum generator 140 from the vacuum chamber 125, the predetermined pressure generated by the compressor 105 is applied 205 on the pressure sensitive device 10. And, when the vacuum valve 135 couples the vacuum generator 140 to the second chamber 125 and the pressure valve 115 de-couples the compressor 105 from the first chamber 120, the predetermined vacuum generated by the vacuum generator 140 is applied 210 on the pressure sensitive device 10.

Hence, the predetermined vacuum applied in the hermetic enclosure of the present invention advantageously clears out debris from the hermetic enclosure, thereby preventing contamination of the hermetic chamber.

FIG. 3 illustrates a flow chart detailing an over pressure test for pressure sensitive devices. With reference to FIGS. 1, 2 and 3, when the pressure sensitive device 10 is to be over pressure tested 305, the pressure sensitive device 10 is located 310 in the socket 155 of the second chamber 125 of the hermetic enclosure 100. The hermetic enclosure 100 is then sealed 315 by inter-coupling the first chamber 120 and the second chamber 125. Subsequently, the predetermined pressure generated by the compressor 105 is applied 320 to the pressure sensitive device 10 by the pressure valve 115 coupling the compressor 105 to the first chamber 120. In the preferred embodiment of the present invention, the predetermined pressure is 930 kilopascal (KPa). After expiry 325 of a predetermined duration, the predetermined pressure on the pressure sensitive device 10 is relieved 330 by the pressure valve 115 de-coupling the compressor 105 from the first chamber 120. The predetermined vacuum generated by the vacuum generator 140 is then applied to the pressure sensitive device 10 by the vacuum valve 135 coupling the vacuum generator 140 to the second chamber 125. The predetermined vacuum need not be applied for a prolonged period, however the predetermined vacuum should be applied for a period that is sufficient to ensure that any contamination by fragments of a pressure sensitive device that failed the over pressure test are cleared out of the hermetic enclosure 100. The predetermined vacuum on the pressure sensitive device 10 is then relieved by the vacuum valve 135 de-coupling the vacuum generator 140 from the second chamber 125. Subsequently, the hermetic enclosure 100 is unsealed 340 by separating the first 120 and second chambers 125, and the pressure sensitive device 10 is removed 345 from the socket 155. A determination is then made whether the pressure sensitive device 10 is intact 350, which can be accomplished by a visual inspection to determine whether the pressure sensitive device has disintegrated. When the over pressure tested pressure sensitive device 10 is intact 350, then the pressure sensitive device 10 passes 355 the over pressure test 350. Alternatively, when the pressure sensitive device 10 is not intact or is disintegrated, the pressure sensitive device 10 fails 360 the over pressure test. Another way of determining whether the pressure sensitive device 10 has passed or failed the over pressure test is by performing an electrical functionality test on the pressure sensitive device 10 after it has been over pressure tested. When the pressure sensitive device 10 is functional, the pressure sensitive device 10 passes the over pressure test, and when the pressure sensitive device 10 fails the functional test the pressure sensitive device 10 fails the over pressure test. Subsequent to determining whether the pressure sensitive device 10 passes or fails the over pressure test, a determination 305 is then made whether another pressure sensitive device is to be tested. And, if there is another pressure sensitive device to be tested, the procedure as described is repeated. Alternatively, when there are no other pressure sensitive devices to be over pressure tested the process ends 365.

In another embodiment of the present invention, the hermetic enclosure 100 comprises the socket 155 for securing the pressure sensitive device 10 within the enclosure 100, and the outlet 130 coupled to the vacuum generator 140 via the vacuum valve 135. A predetermined vacuum generated by the vacuum generator 140 is applied via the vacuum valve 135 to the second side 170 of the pressure sensitive device 10 for the predetermined duration, where the predetermined vacuum is of such a magnitude that results in the predetermined pressure acting on the first side 160 of the pressure sensitive device 10. Hence, when the pressure sensitive device 10 fails the over pressure test and disintegrates, the predetermined vacuum removes the disintegrated fragments of the failed pressure sensitive device 10, thereby preventing contamination of the hermetic enclosure 100.

In accordance with the present invention, a hermetic enclosure for over pressure testing pressure sensitive devices which does not cause contamination can be realized. This is achieved by a hermetic enclosure which is coupled to a compressor and a vacuum generator. A pressure sensitive device to be over pressure tested is secured in a socket in the hermetic enclosure, and the hermetic enclosure is subsequently sealed. A predetermined pressure is then applied by the compressor to the hermetic enclosure for a predetermined duration, after which a predetermined vacuum is applied to the hermetic enclosure. When the pressure sensitive device fails the over pressure test, the pressure sensitive device disintegrates into fragments which contaminate the hermetic enclosure. A predetermined vacuum is then applied to the hermetic enclosure, advantageously removing the disintegrated fragments from the enclosure and preventing the disintegrated fragments from contaminating the enclosure and other pressure sensitive devices that are subsequently over pressure tested in the hermetic enclosure.

Hence, an over pressure test chamber in accordance with the present invention can be used for over pressure testing pressure sensor ICs and which does not cause contamination.

What is claimed is:

1. A method for over pressure testing a pressure sensitive integrated circuit, the method comprising the steps of:
   a) locating the pressure sensitive integrated circuit in a socket in a hermetic enclosure having an inlet and an outlet;
   b) applying a predetermined pressure on a first surface of the pressure sensitive integrated circuit via the inlet of the hermetic enclosure;
   c) applying a predetermined vacuum on a second surface of the pressure sensitive integrated circuit different from the first surface via the outlet of the hermetic enclosure; and
   d) removing the pressure sensitive integrated circuit from within the enclosure.

2. The method of claim 1 wherein the step after step (a) and prior to step (b) comprises the step of sealing the hermetic enclosure, and wherein the step after step (c) prior to step (d) comprises the step of unsealing the hermetic enclosure.

3. The method of claim 1 wherein step (b) comprises the steps of:
   applying the predetermined pressure to the hermetic enclosure via the inlet of the hermetic enclosure causing the pressure sensitive device to disintegrate into fragments; and
   wherein step (c) comprises the step of:
   applying the predetermined vacuum to the hermetic enclosure via the outlet of the hermetic enclosure to remove the fragments of the pressure sensitive integrated circuit to prevent contamination of the hermetic enclosure.

4. The method of claim 1 wherein the step after step (b) prior to step (c) comprises the step of relieving the predetermined pressure after a predetermined duration.

5. The method of claim 4 wherein the step prior to step (c) comprises the step of:
   if the pressure sensitive integrated circuit disintegrates into fragments prior to expiration of the predetermined duration, removing the disintegrated fragments to prevent contamination of the hermetic enclosure.

6. The method of claim 1 wherein the step after step (d) comprises the step of determining the pressure sensitive integrated circuit passes the over pressure test when the pressure sensitive integrated circuit is intact.

7. The method of claim 6 wherein determining whether the pressure sensitive integrated circuit is intact comprises the step of visually examining the pressure sensitive integrated circuit.

8. The method of claim 6 wherein determining whether the pressure sensitive integrated circuit is intact comprises the step of electrically testing the functionality of the pressure sensitive integrated circuit.

9. The method of claim 1 wherein the step after step (d) comprises the step of determining the pressure sensitive integrated circuit fails the over pressure test when the pressure sensitive integrated circuit is disintegrated.

10. The method of claim 9 wherein determining whether the pressure sensitive integrated circuit is disintegrated comprises the step of visually examining the pressure sensitive integrated circuit.

11. The method of claim 9 wherein determining whether the pressure sensitive integrated circuit is disintegrated comprises the step of electrically testing the functionality of the pressure sensitive integrated circuit.

12. An apparatus for over pressure testing a pressure sensitive integrated circuit, the apparatus comprising:
    a hermetic enclosure comprising:
        a socket for securing the pressure sensitive integrated circuit thereon;
        an inlet coupled to a compressor for applying a predetermined pressure on a first surface of the pressure sensitive integrated circuit; and
        an outlet coupled to a vacuum generator for applying a predetermined vacuum on a second surface of the pressure sensitive integrated circuit different from the first surface.

13. The apparatus of claim 12 wherein a pressure valve is coupled between the inlet and the compressor for coupling the compressor to the inlet to apply the predetermined pressure to the pressure sensitive integrated circuit, and for de-coupling the compressor from the inlet to relieve the predetermined pressure applied to the pressure sensitive integrated circuit.

14. The apparatus of claim 12 wherein a vacuum valve is coupled between the outlet and the vacuum generator for coupling the vacuum generator to the outlet to apply the predetermined vacuum to the pressure sensitive integrated circuit, and for de-coupling the vacuum generator from the outlet to relieve the predetermined vacuum applied to the pressure sensitive integrated circuit.

15. The apparatus of claim 12 wherein the hermetic enclosure comprises a first chamber coupled to the inlet, and a second chamber coupled to the outlet, wherein the first and second chamber separate to locate the pressure sensitive integrated circuit therebetween, and wherein the first and second chamber inter-couple to seal the pressure sensitive integrated circuit in the hermetic enclosure.

16. The apparatus in claim 15 wherein the first chamber confines the predetermined pressure to a first side of the pressure sensitive integrated circuit, and wherein the second chamber confines the predetermined vacuum to a second side of the pressure sensitive integrated circuit, different from the first side of the pressure sensitive integrated circuit.

17. The apparatus of claim 16 wherein the second side of the pressure sensitive integrated circuit is diametrically opposite to the first side of the pressure sensitive integrated circuit.

18. An apparatus for over pressure testing a pressure sensitive integrated circuit, the apparatus comprising:
    a hermetic enclosure comprising:
        a socket for securing the pressure sensitive integrated circuit thereon; and
        an outlet coupled to a vacuum generator for applying a predetermined vacuum on one surface of the pressure sensitive integrated circuit, the predetermined vacuum removing fragments of the pressure sensitive integrated circuit formed within the hermetic chamber to prevent contamination of the hermetic chamber.

* * * * *